(12) United States Patent
Yee

(10) Patent No.: US 7,750,736 B2
(45) Date of Patent: Jul. 6, 2010

(54) INTEGRATED CIRCUIT SYSTEM FOR CONTROLLING AMPLIFIER GAIN

(75) Inventor: Philip W. Yee, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 125 days.

(21) Appl. No.: 12/109,754

(22) Filed: Apr. 25, 2008

(65) Prior Publication Data
US 2008/0297250 A1    Dec. 4, 2008

Related U.S. Application Data

(60) Provisional application No. 60/941,116, filed on May 31, 2007.

(51) Int. Cl.
*H03F 3/45* (2006.01)
(52) U.S. Cl. .................. 330/254; 330/257; 330/307
(58) Field of Classification Search .......... 330/253, 330/254, 257, 278, 307
See application file for complete search history.

(56) References Cited

U.S. PATENT DOCUMENTS

| | | | |
|---|---|---|---|
| 4,766,394 A * | 8/1988 | Yukawa | ............ 330/253 |
| 5,999,052 A | 12/1999 | Tang | |
| 6,316,997 B1 | 11/2001 | Tammone, Jr. | |
| 7,239,199 B1 | 7/2007 | Chien et al. | |
| 7,292,099 B2 | 11/2007 | Stoger et al. | |

* cited by examiner

*Primary Examiner*—Khanh V Nguyen
(74) *Attorney, Agent, or Firm*—Mikio Ishimaru

(57) ABSTRACT

An integrated circuit system comprising: forming a differential amplifier including: forming a first transistor, coupling a second transistor to the first transistor in a high gain configuration, and coupling a third transistor, having a low gain configuration, in parallel with the second transistor; and adjusting a gain of the differential amplifier by adjusting a ratio of the size of the second transistor to the size of the first transistor.

20 Claims, 2 Drawing Sheets

INTEGRATED CIRCUIT SYSTEM FOR CONTROLLING AMPLIFIER GAIN

CROSS-REFERENCE TO RELATED APPLICATION

This application claims the benefit of U.S. Provisional Patent Application Ser. No. 60/941,116 filed on May 31, 2007, and the subject matter thereof is hereby incorporated herein by reference thereto.

TECHNICAL FIELD

The present invention relates generally to integrated circuits, and more particularly to a system for adjusting the gain of an amplifier in integrated circuits.

BACKGROUND ART

Modern electronics, such as smart phones and personal digital assistants, are packing more integrated circuit functions into an ever-shrinking physical space with expectations for decreasing cost. In order to facilitate these requirements, several functions may reside within the device. These functions may include wireless internet access, a camera, address book, or a data storage and retrieval system. Each of these functions will share the same user interface controls for their operation. As the individual functions may supply different levels of interface signals an amplifier must provide a gain control path so that several functional sources may share the same user interface structure.

Historically the amplifier has been the primary signal amplitude management structure throughout the analog electronics world. There are several aspects of an amplifier that must be satisfied in order for it to meet the requirements of the design. The primary amplifier architecture used in analog integrated circuits is the differential amplifier. The differential amplifier is typically made up of a closely matched pair of transistors that are positioned very close together in the circuit and coupled in a common gate configuration. An additional pair of transistors may be used as input signal paths to the amplifier.

The gain (A) of an amplifier controls the amount of "boost" a signal is subjected to in the amplification process. The gain may be greater than 1 in order to grow a signal or less than 1 in order to shrink the signal to a proper interface level. The gain (A) may be represented in an equation by the transconductance ($g_{md}$) of the signal input transistors, M1 and M2, times the output impedance of M2 ($1/g_{ds2}$) in parallel with the output impedance of the differential transistor M4 that drives the output voltage Vout. This can be shown in equation 1 below.

$$A = \frac{g_{md}}{g_{ds2} + g_{ds4}} \quad (1)$$

Often it is desirable to decrease the gain (A) of a stage. The gain (A) can be adjusted to a very limited extent by changing the geometries, as in the physical dimensions of the transistors in the circuit. The gain (A) may also be decreased bay adding a source resistor in each leg of the differential input. The resistors (R1 and R2) may be very large due to the small currents that are normally used in the amplifier circuits. If the resistors (R1 and R2) are too large it may not be practical to implement them because their physical size would surpass the size of the transistors in the amplifier.

A low gain amplifier circuit may be implemented by separating the gates of the differential pair transistors (M3 and M4) and individually coupling the gate to their own drain of the transistors. The gain, within a factor of 2, may be calculated by equation 2 below.

$$A = \frac{g_{md}}{g_{ds2} + g_{m4}} \quad (2)$$

The transconductance ($g_{m4}$) is much greater than $g_{ds2}$ or $g_{ds4}$ and therefore greatly reduces the gain. This circuit, however, only reduces the gain to a very low fixed value. The difficulty associated with adjusting the gain of the differential amplifier to some intermediate level has been very difficult for the designer and the manufacturing process.

Thus, a need still remains for an integrated circuit system for controlling amplifier gain. In view of the demand for an increased number of functions in the standard package formats, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: forming a differential amplifier including: forming a first N-channel transistor, coupling a second N-channel transistor to the first N-channel transistor in a high gain configuration, and coupling a third N-channel transistor, having a low gain configuration, in parallel with the second N-channel transistor; and adjusting a gain of the differential amplifier by adjusting a ratio of the size of the second N-channel transistor to the size of the first N-channel transistor.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
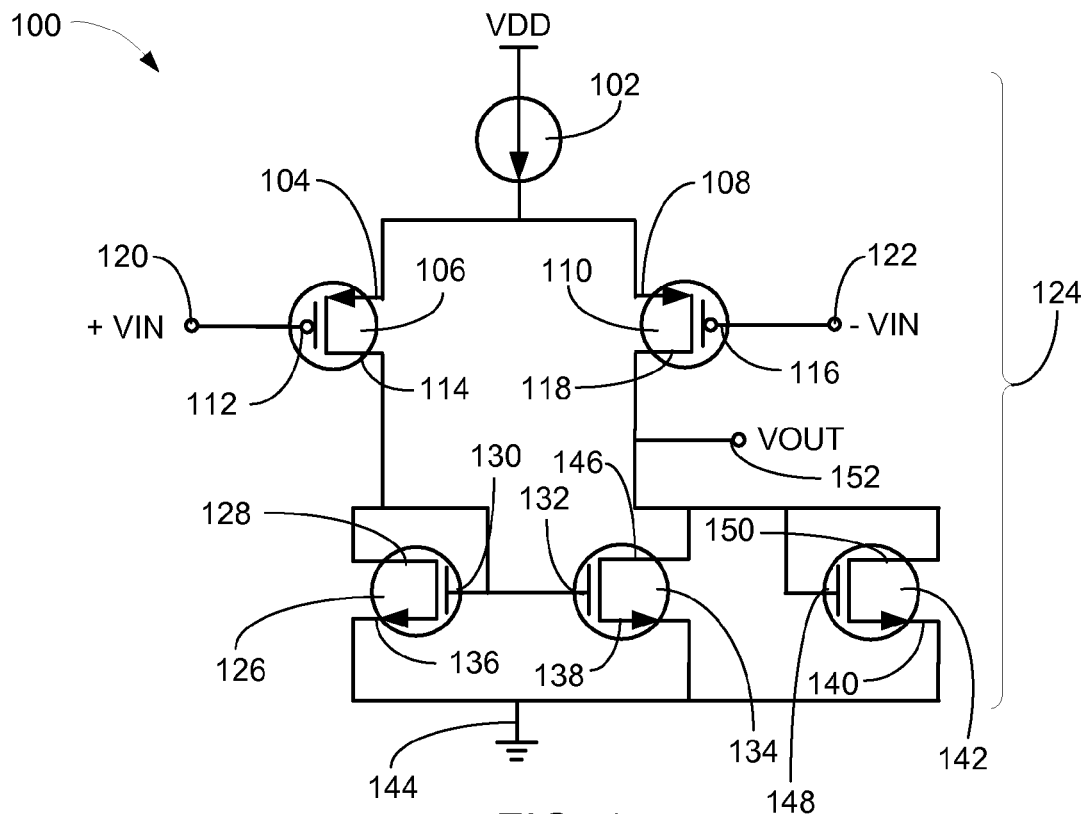
FIG. 1 is a schematic of an integrated circuit system for controlling amplifier gain, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a schematic of an integrated circuit system 100 for controlling amplifier gain, in an embodiment of the present invention. The schematic of the integrated circuit system 100 depicts a current source 102 coupled to a first reference voltage, such as VDD. The current source 102 may be coupled to a first P-source 104 of a first P-channel transistor 106, such as a metal oxide semiconductor field effect transistor (MOSFET), and a second P-source 108 of a second P-channel transistor 110, such as a MOSFET.

The first P-channel transistor 106 may have a first P-gate 112 and a first P-drain 114. The second P-channel transistor 110 may have a second P-gate 116 and a second P-drain 118. The first P-gate 112 may be coupled to a +voltage-in node 120 and the second P-gate 116 may be coupled to a —voltage-in node 122. The combination of the +voltage-in node 120 and the—voltage-in node 122 comprise the differential input of a differential amplifier 124.

A first transistor 126, such as an N-channel transistor, having a first drain 128 and a first gate 130 that may be coupled to each other, a second gate 132 of a second transistor 134, such as an N-channel transistor, and the first P-drain 114 of the first P-channel transistor 106. A first source 136 of the first transistor 126 may be coupled to a second source 138 of the second transistor 134, a third source 140 of a third transistor 142, such as an N-channel transistor, and a second reference voltage 144, such as ground. This configuration may provide a high gain through the second transistor 134.

A second drain 146 of the second transistor 134 may be coupled to a third gate 148 and a third drain 150 of the third transistor 142. This coupling provides the third transistor 142 as a low gain stage. By adding the low gain stage in parallel to the high gain stage, it is now possible to vary the size of the second transistor 134 without creating an unbalanced current flow. The second drain 146 may also be coupled to a voltage out node 152 and the second P-drain 118.

The first transistor 126 may be configured as a high gain stage by coupling the first drain 128 and the first gate 130 to the second gate 132. In prior art amplifiers the geometry of the first transistor 126 must be equal to the geometry of the second transistor 134. This balanced geometry maintains the symmetry of the output signal relative to the input signal.

The integrated circuit system 100, of the present invention adds an additional low gain stage in the form of the third transistor 142. The geometry of the second transistor 134 and the geometry of the third transistor 142 when added together may be equal to the geometry of the first transistor 126. By maintaining the balance of the total geometry of the transistors, the output signal remains symmetrical with the input signal. As shown in equation 3, the size of the first transistor 126 is equal to the total size of the second transistor 134 and the third transistor 142.

$$\text{SIZE } N1 = \text{SIZE } N2 + \text{SIZE } N3 \quad (3)$$

The size in equation 3 represents the relative length and width of the individual transistors. The size of the transistor determines its ability to conduct a current, thus by having a balance in the size of the geometries, the current will be balanced between the sides of the differential amplifier 124. The output conductance of the parallel combination of the second transistor 134 and the third transistor 142 may be represented by equation 4 below.

$$g_{23} = rg_3 + (1-r)g_4 \quad (4)$$

The transconductance of the parallel set of the second transistor 134 and the third transistor 142, $g_{23}$, is provided where:

The symbol r is the ratio of the size of the second transistor 134 to the size of the first transistor 126.

The symbol $g_3$ is the output conductance of the second transistor 134.

The symbol $g_4$ is the transconductance of the third transistor 142.

Further it has been discovered that the overall gain of the differential amplifier 124 may be controlled by adjusting the ratio (r) of the geometry of the second transistor 134 relative to the first transistor 126. The output gain of the differential amplifier 124 may be calculated by the algorithm in equation 5 below.

$$A(r) = \frac{g_{12}}{g_2 + rg_3 + (1-r)g_4} \quad (5)$$

Where:

The symbol A(r) is the output gain of the differential amplifier 124.

The symbol $g_{12}$ is the transconductance of the first P-channel transistor 106 and the second P-channel transistor 110 added together.

The symbol $g_2$ is the output conductance of the second P-channel transistor 110.

The symbol r is the ratio of the size of the second transistor 134 to the size of the first transistor 126.

The symbol $g_3$ is the output conductance of the second transistor 134.

The symbol $g_4$ is the transconductance of the third transistor 142.

It has been unexpectedly discovered that the integrated circuit system 100 of the present invention represents the minimum number of transistors and the smallest geometry required to implement an adjustable output gain of the differential amplifier 124.

Figure 2:
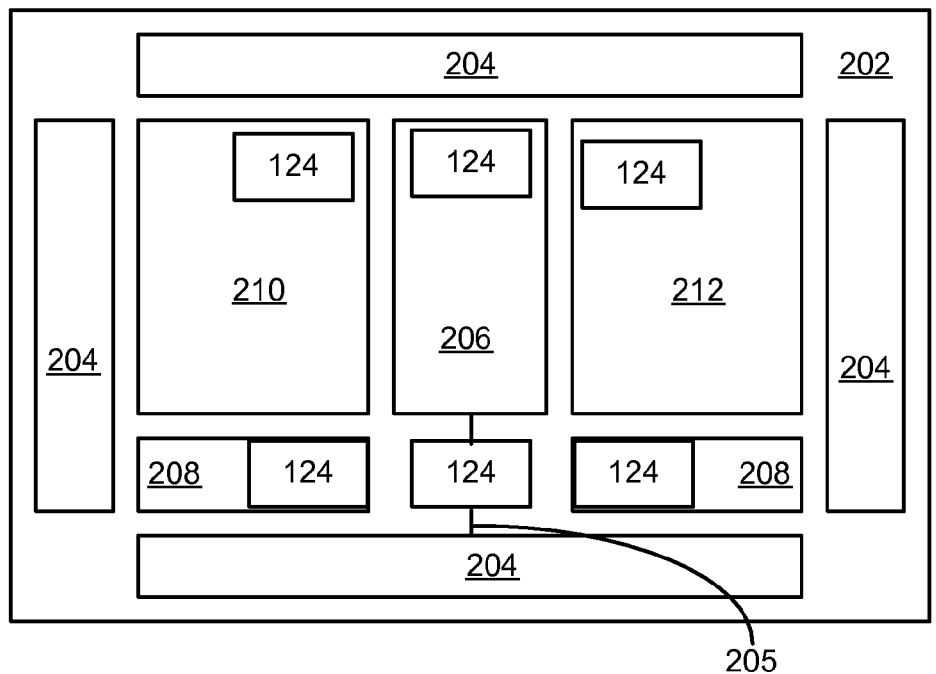
FIG. 2 is a functional block diagram of an integrated circuit having the integrated circuit system for controlling amplifier gain.

Referring now to FIG. 2, therein is shown a functional block diagram of an integrated circuit 200 having the differential amplifier 124 for controlling amplifier gain. The functional block diagram of the integrated circuit 200 depicts a substrate 202, such as a semiconductor wafer, having an input/output block 204. The differential amplifier 124 may provide a level translation, of a signal line 205, between the input/output block 204 and a processor block 206. The processor block 206 may use the differential amplifier 124 to provide an early warning of power loss. A built in self test block 208 may include the differential amplifier 124 for providing control and detection capability.

A sensor array 210 may utilize the differential amplifier 124 to boost the sensor output level for communication to the processor block 206 or the input/output block 204. A digital to analog converter block 212 may use the differential amplifier 124 to provide a noise rejection mechanism for a sample and hold circuit.

The above description is by way of an example only. The differential amplifier 124 as provided by the integrated circuit system 100 may be used in many other applications. The differential amplifier 124 may provide accurate gain adjustment as provided by the integrated circuit system 100 without the addition of physically large resistors. This aspect of the current invention may enable the further application of the integrated circuit system 100 in applications where space on the substrate 202 is at a premium.

Figure 3:
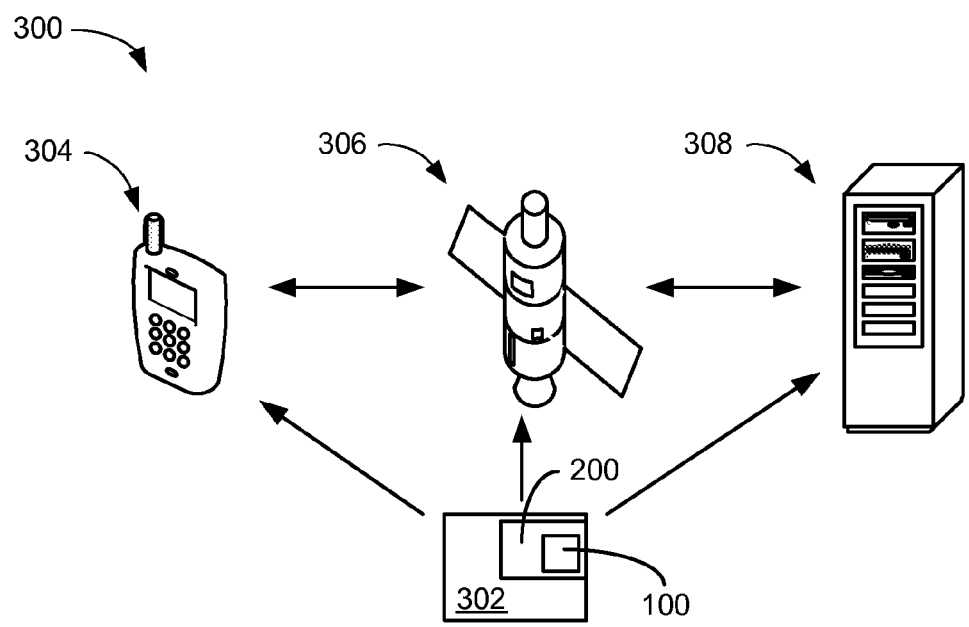
FIG. 3 is a functional view of a device that includes the integrated circuit system for controlling amplifier gain.

Referring now to FIG. 3, therein is shown a functional view of a device application 300 that includes the integrated circuit system 100 for controlling amplifier gain. The functional view of the device application 300 depicts a circuit board 302, such as a printed circuit board, a flex circuit, a ceramic circuit board, or a thin film substrate, having the integrated circuit 200 that utilizes the integrated circuit system 100. The circuit board 302 may be utilized in a device 304, such as a cellular telephone, to provide an interface for the embedded camera (not shown). The circuit board 302 may be used in a device 306, such as a communication satellite system, for providing signal amplification and self diagnostic capabilities. The circuit board 302 may also be utilized in a device 308, such as a computer system, to provide interface level translation, diagnostic capabilities, clock distribution, power monitoring, or a combination thereof.

The above listed applications are by way of an example only and are not intended to limit the applications of the integrated circuit system 100. In any environment where electrical noise is present, the integrated circuit system 100 may have many more possible applications.

Figure 4:
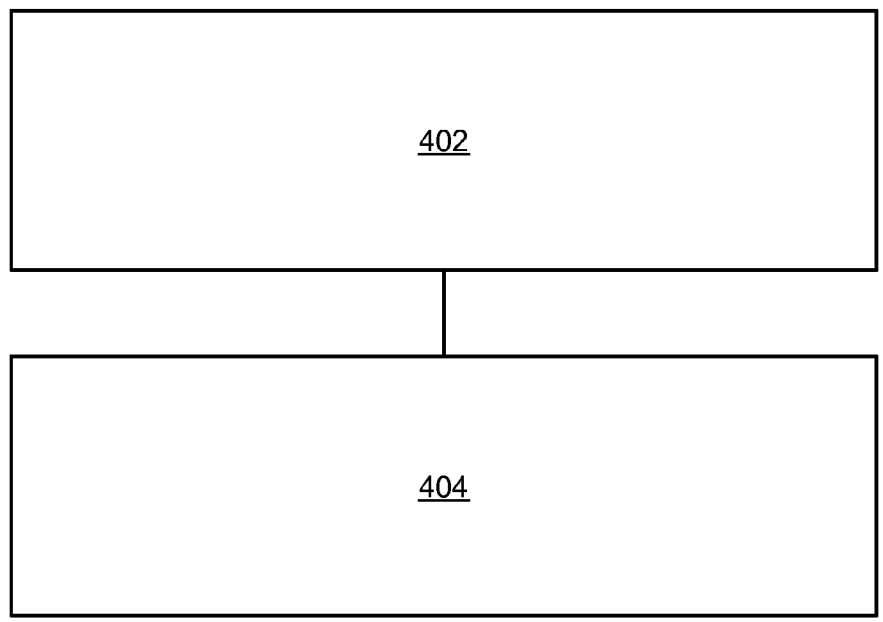
FIG. 4 is a flow chart of an integrated circuit system for manufacturing the integrated circuit system for controlling amplifier gain, in an embodiment of the present invention.

Referring now to FIG. 4, therein is shown a flow chart of an integrated circuit system 400 for manufacturing the integrated circuit system 100 for controlling amplifier gain, in an embodiment of the present invention. The system 400 includes forming a differential amplifier including: forming a first transistor, coupling a second transistor to the first transistor in a high gain configuration, and coupling a third transistor, having a low gain configuration, in parallel with the second transistor in a block 402; and adjusting a gain of the differential amplifier by adjusting a ratio of the size of the second transistor to the size of the first transistor in a block 404.

It has been discovered that the present invention thus has numerous aspects.

An aspect that has been unexpectedly discovered is that the present invention represents the minimum number of transistors and the smallest geometry required to implement an adjustable output gain of the differential amplifier.

Another aspect is that the integrated circuit system 100 may provide accurate gain adjustment as provided by the differential amplifier 124 without the addition of physically large resistors.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system for controlling amplifier gain of the present invention furnishes important and heretofore unknown and unavailable solutions, capabilities, and functional aspects for integrated circuits having analog functions or level detection. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacturing an integrated circuit system comprising:
    forming a differential amplifier including:
        forming a first transistor,
        coupling a second transistor to the first transistor in a high gain configuration, and
        coupling a third transistor, having a low gain configuration, in parallel with the second transistor; and
    adjusting a gain of the differential amplifier by adjusting a ratio of the size of the second transistor to the size of the first transistor.

2. The method as claimed in claim 1 wherein coupling the second transistor includes:
    forming a first drain on the first transistor;
    coupling a first gate to the first drain; and
    coupling a second gate, on the second transistor, to the first gate and the first drain for forming the high gain configuration.

3. The method as claimed in claim 1 wherein coupling the third transistor includes:
forming a second drain on the second transistor;
coupling a third gate, on the third transistor, to the second drain; and
coupling a third drain, on the third transistor, to the third gate and the second drain for forming the low gain configuration in parallel with the second transistor.

4. The method as claimed in claim 1 further comprising forming an integrated circuit having the differential amplifier.

5. The method as claimed in claim 1 further comprising forming a device application including:
fabricating an integrated circuit having the differential amplifier;
fabricating a circuit board for mounting the integrated circuit; and
assembling a device having the circuit board mounted therein.

6. A method of manufacturing an integrated circuit system comprising:
forming a differential amplifier including:
forming a current source,
coupling a first P-channel transistor to the current source,
forming a first N-channel transistor coupled to the first P-channel transistor,
coupling a second N-channel transistor to the first N-channel transistor in a high gain configuration including coupling a second P-channel transistor between the current source and the second N-channel transistor, and
coupling a third N-channel transistor, having a low gain configuration, in parallel with the second N-channel transistor including coupling a voltage out node between the third N-channel transistor and the second P-channel transistor; and
adjusting a gain of the differential amplifier by adjusting a ratio of the size of the second N-channel transistor to the size of the first N-channel transistor including sizing the third N-channel transistor and the second N-channel transistor to collectively equal the size of the first N-channel transistor.

7. The method as claimed in claim 6 wherein coupling the second N-channel transistor includes:
forming a first N-drain on the first N-channel transistor including forming a first N-source;
coupling a first N-gate to the first N-drain including coupling a second reference voltage to the first N-source; and
coupling a second N-gate, on the second N-channel transistor, to the first N-gate and the first N-drain for forming the high gain configuration including forming a second N-source coupled to the second reference voltage.

8. The method as claimed in claim 6 wherein coupling the third N-channel transistor includes:
forming a second N-drain on the second N-channel transistor including coupling a second P-drain to the second N-drain;
coupling a third N-gate, on the third N-channel transistor, to the second N-drain including coupling a third N-source to a second reference voltage; and
coupling a third N-drain, on the third N-channel transistor, to the third N-gate and the second N-drain for forming the low gain configuration in parallel with the second N-channel transistor including coupling the second P-drain of the second P-channel transistor.

9. The method as claimed in claim 6 further comprising forming an integrated circuit having the differential amplifier including:
providing a semiconductor wafer;
fabrication an input/output block on the semiconductor wafer; and
conditioning a signal from the input/output block with the differential amplifier.

10. The method as claimed in claim 6 further comprising forming a device application including:
fabricating an integrated circuit having the differential amplifier including translating a signal line;
fabricating a circuit board for mounting the integrated circuit including fabricating a printed circuit board, a flex circuit, a ceramic circuit board, or a thin film substrate; and
assembling a device having the circuit board mounted therein including providing level translation, diagnostic capabilities, clock distribution, power monitoring, or a combination thereof by the differential amplifier.

11. An integrated circuit system comprising:
a differential amplifier including:
a first transistor,
a second transistor coupled to the first transistor in a high gain configuration, and
a third transistor, having a low gain configuration, in parallel with the second transistor; and
a gain of the differential amplifier adjusted by a ratio of the size of the second transistor to the size of the first transistor.

12. The system as claimed in claim 11 wherein the second transistor coupled includes:
a first drain on the first transistor;
a first gate coupled to the first drain; and
a second gate, on the second transistor, coupled to the first gate and the first drain for forming the high gain configuration.

13. The system as claimed in claim 11 wherein coupling the third transistor includes:
a second drain on the second transistor;
a third gate, on the third transistor, coupled to the second drain; and
a third drain, on the third transistor, coupled to the third gate and the second drain for forming the low gain configuration in parallel with the second transistor.

14. The system as claimed in claim 11 further comprising an integrated circuit with the differential amplifier therein.

15. The system as claimed in claim 11 further comprising a device application including:
an integrated circuit fabricated with the differential amplifier;
a circuit board with the integrated circuit mounted thereon; and
a device assembled with the circuit board mounted therein.

16. The system as claimed in claim 11 further comprising:
a current source in the differential amplifier;
a first P-channel transistor coupled to the current source and the first transistor;
a second P-channel transistor between the current source and the second transistor;
a voltage out node between the third transistor and the second P-channel transistor; and
the third transistor and the second transistor collectively equal the size of the first transistor.

17. The system as claimed in claim 16 wherein the second transistor coupled to the first transistor includes:
- a first drain on the first transistor includes a first source;
- a first gate coupled to the first drain includes a second reference voltage coupled to the first source; and
- a second gate, on the second transistor, coupled to the first gate and the first drain for forming the high gain configuration includes a second source coupled to the second reference voltage.

18. The system as claimed in claim 16 wherein the third transistor in parallel includes:
- a second drain on the second transistor includes a second P-drain coupled to the second drain;
- a third gate, on the third transistor, coupled to the second drain includes a third source coupled to a second reference voltage; and
- a third drain, on the third transistor, coupled to the third gate and the second drain for forming the low gain configuration in parallel with the second transistor includes the P-drain, of the second P-channel transistor, coupled.

19. The system as claimed in claim 16 further comprising an integrated circuit with the differential amplifier includes:
- a semiconductor wafer;
- an input/output block on the semiconductor wafer; and
- a signal line from the input/output block conditioned by the differential amplifier.

20. The system as claimed in claim 16 further comprising a device application includes:
- an integrated circuit fabricated with the differential amplifier includes a signal line between an input/output block and the differential amplifier;
- a circuit board with the integrated circuit mounted thereon includes a printed circuit board, a flex circuit, a ceramic circuit board, or a thin film substrate; and
- a device with the circuit board mounted therein includes level translation, diagnostic capabilities, clock distribution, power monitor, or a combination thereof by the differential amplifier.

* * * * *